(12) United States Patent
Reiss et al.

(10) Patent No.: US 9,071,256 B1
(45) Date of Patent: Jun. 30, 2015

(54) METHOD FOR LINK RESETS IN A SERDES SYSTEM

(71) Applicant: Cadence Design Systems, Inc., San Jose, CA (US)

(72) Inventors: Loren Blair Reiss, Raleigh, NC (US); Chris Moscone, Cary, NC (US); Benjamin Louis Heilmann, Raleigh, NC (US); Randall Smith, Raleigh, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/311,648

(22) Filed: Jun. 23, 2014

(51) Int. Cl.
*H03M 9/00* (2006.01)

(52) U.S. Cl.
CPC ..................... *H03M 9/00* (2013.01)

(58) Field of Classification Search
CPC ......... H04L 7/04; H04L 7/0008; H04L 7/033; H04L 7/0091; H04L 21/2225; H04L 21/61; H04L 21/6405; H04L 21/6402; H04L 25/14; G06F 13/4217; H03K 5/135; H03M 9/00; H03M 5/04; G01R 31/2853; G01R 31/3187; G01R 31/31855; G01R 31/31715; H01L 2224/32225; H01L 2224/48227; H01L 2224/73265; H01L 2224/73204; H01L 2924/00

USPC ........... 341/100–101; 375/365, 371; 370/503, 370/509, 517, 539, 412, 40

See application file for complete search history.

(56) References Cited

U.S. PATENT DOCUMENTS

| | | | |
|---|---|---|---|
| 5,101,202 A * | 3/1992 | Chaisemartin et al. | 341/100 |
| 6,609,167 B1 * | 8/2003 | Bastiani et al. | 710/104 |
| 6,636,922 B1 * | 10/2003 | Bastiani et al. | 710/305 |
| 6,653,957 B1 * | 11/2003 | Patterson et al. | 341/100 |
| 7,012,935 B2 * | 3/2006 | Woelk et al. | 370/503 |
| 7,064,690 B2 * | 6/2006 | Fowler et al. | 341/101 |
| 7,091,890 B1 * | 8/2006 | Sasaki et al. | 341/100 |

\* cited by examiner

*Primary Examiner* — Lam T Mai

(74) *Attorney, Agent, or Firm* — Holland & Knight LLP; Mark H. Whittenberger, Esq.

(57) ABSTRACT

The present disclosure relates to a method for use with a serializer/deserializer comprising. The method may include grouping one or more lane modules associated with an integrated circuit (IC) together to form a link, wherein each of the one or more lane modules includes a reset state machine and a high speed reset generator. The method may also include providing a common module having a common reset release state machine and a reset release synchronizer and pulse generator, the common module and one or more lane modules being configured to communicate therebetween. The method may further include resetting each link independently using the one or more lane modules.

20 Claims, 7 Drawing Sheets

700

METHOD FOR LINK RESETS IN A SERDES SYSTEM

FIELD OF THE INVENTION

The present disclosure relates to a serializer/deserializer systems, and more specifically, to a method for link resets in a SerDes system.

DISCUSSION OF THE RELATED ART

Serializer/deserializer ("SerDes") components are becoming common on integrated System-on-a-chip ("SOC") and Application Specific Integrated Circuits ("ASICs"). The trend has involved increasing the number of serial links at higher and higher speeds in smaller geometry processes. This may be necessary in order to provide the data transmission requirements of higher capacity chips that are severely pin limited. A high speed serial link requires data and clock recovery for wired applications such as backplanes, networks and chip to chip communication. Some industry standards for this type of communication include but are not limited to, Peripheral Component Interconnect Express ("PCIe"), Common Electrical Interface ("CEI-6"), 10 Gigabit Attachment Unit Interface ("XAUI") (IEEE 802.3ae), Serial ATA ("SATA"), Fibrechannel, 802.3ap (e.g., 10 GBASE-KR) and others. In this way, transfer data rates from 2.5 Gb/s, up to as high as 20 Gb/s are becoming common.

Some SerDes standards have tight restrictions for lane-to-lane transmit data skew requirements. This often mandates unique reset strategies and/or alignment circuits. For single link, multi-lane configurations, this is a challenging design problem. For multi-link, multi-lane configurations running independently, the problem becomes extremely challenging. This may be further complicated when different links are running at different data rates, or even using different standards.

SUMMARY OF INVENTION

In one embodiment of the present disclosure a method for use with a serializer/deserializer is provided. The method may include grouping one or more lane modules associated with an integrated circuit (IC) together to form one or more links, wherein each of the one or more lane modules includes a reset state machine and a high speed reset generator. The method may also include providing a common module having a common reset release state machine and a reset release synchronizer and pulse generator, the common module and one or more lane modules being configured to communicate therebetween. The method may further include resetting each link independently using the one or more lane modules.

One or more of the following features may be included. The one or more lane modules may include a master lane configured to reset a slave lane. The high speed reset generator may be configured to generate a reset signal for a clock divider. The reset state machine may be configured to hold the high speed reset generator and determine when to search for a high speed reset pulse. The common reset release state machine may be configured to receive a request to generate a reset pulse from the lane reset state machine. The common reset release state machine may be configured to arbitrate between one or more requests and generate a reset pulse request. The reset release synchronizer and pulse generator may be configured to synchronize the reset pulse request and generate a high speed reset release pulse to each of the one or more lane modules. The high speed reset release pulse may be synchronously launched and captured.

In another embodiment of the present disclosure an apparatus is provided. The apparatus may include an integrated circuit (IC) including one or more lane modules grouped together to form one or more links and a common module having a common reset release state machine and a reset release synchronizer and pulse generator, wherein each of the one or more lane modules includes a reset state machine and a high speed reset generator, and wherein each link is capable of being reset independently of another link.

One or more of the following features may be included. The one or more lane modules may include a master lane configured to reset a slave lane. The high speed reset generator may be configured to generate a reset signal for a clock divider. The reset state machine may be configured to hold the high speed reset generator and determine when to search for a high speed reset pulse. The common reset release state machine may be configured to receive a request to generate a reset pulse from the lane reset state machine. The common reset release state machine may be configured to arbitrate between one or more requests and generate a reset pulse request. The reset release synchronizer and pulse generator may be configured to synchronize the reset pulse request and generate a high speed reset release pulse to each of the one or more lane modules. The high speed reset release pulse may be synchronously launched and captured.

In yet another embodiment of the present disclosure, a method for use with a serializer/deserializer is provided. The method may include grouping one or more lane modules associated with an integrated circuit (IC) together to form one or more links, wherein each of the one or more lane modules includes a reset state machine and a high speed reset generator. The method may further include providing a common module having a common reset release state machine, the common module and one or more lane modules being configured to communicate therebetween. The method may also include resetting each link independently using the one or more lane modules.

One or more of the following features may be included. A reset release pulse may be asynchronously passed to the one or more lanes. The one or more links may include a plurality of links each complying with a different transmission protocol. At least one of the transmission protocols may include Peripheral Component Interconnect Express.

Additional features and advantages of embodiments of the present disclosure may be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the present disclosure as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

The present disclosure generally relates to systems and methods for link resets in a multi-link and lane SerDes system. Embodiments of the present disclosure include both single data rate and multiple data rate approaches.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
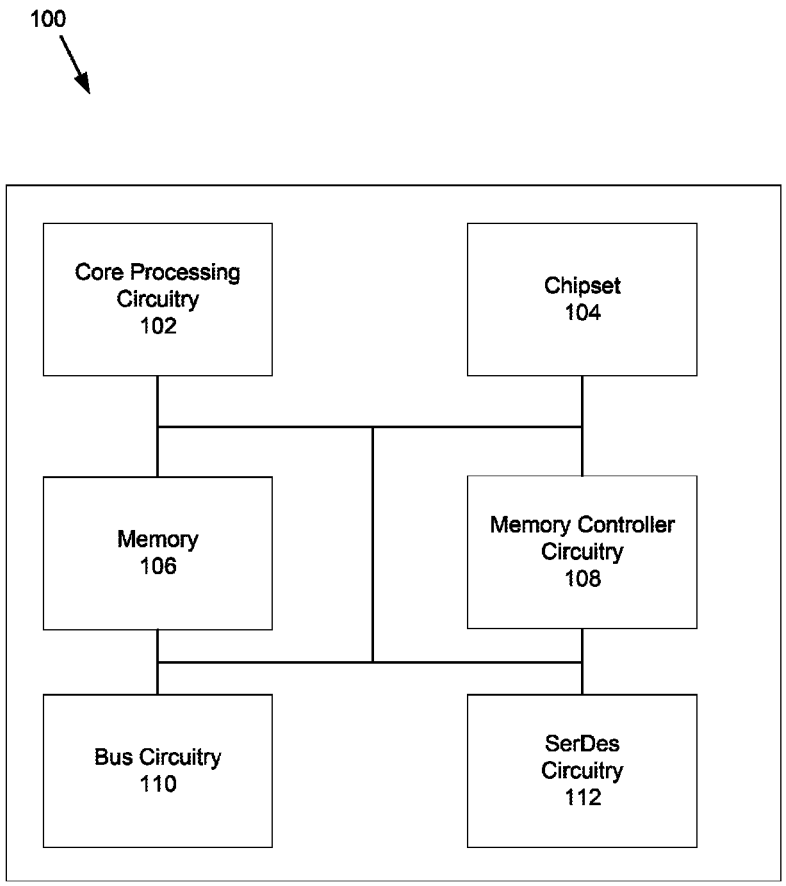
FIG. 1 is a diagram depicting an integrated circuit that may implement an embodiment of a link reset process in accordance with the present disclosure.

Referring now to FIG. 1, an embodiment of an integrated circuit (IC) 100 in accordance with the present disclosure is shown. The term "integrated circuit", as used in any embodiment herein, may refer to a semiconductor device and/or microelectronic device, such as, for example, but not limited to, a semiconductor integrated circuit chip. The specific configuration, arrangement, and components shown in IC 100 are provided merely for exemplary purposes as additional and/or alternative configurations are also within the scope of the present disclosure.

In some embodiments, IC 100 may include core processing circuitry 102, which may include a variety of different processors such as those known in the art. Any suitable processor may be used without departing from the scope of the present disclosure. IC 100 may also include chipset 104. In some embodiments, chipset 104 may include both Northbridge/memory controller hub (MCH) and Southbridge/I/O controller hub (ICH) circuitry. These components may be included within chipset 104 or at any other location within IC 100. IC 100 may also include memory 106, which may be in communication with core processing circuitry 102. Memory 106 may comprise one or more of the following types of memories: semiconductor firmware memory, programmable memory, non-volatile memory, read only memory, electrically programmable memory, random access memory, flash memory (which may include, for example, NAND or NOR type memory structures), magnetic disk memory, and/or optical disk memory. Either additionally or alternatively, memory may comprise other and/or later-developed types of computer-readable memory. In some embodiments, memory 106 may include, for example, 256 KB of two-way level 2 cache. IC 100 may additionally include memory controller circuitry 108 configured to manage the flow of data to and from memory. For example, in some embodiments, memory controller circuitry 108 may include a double-data-rate two synchronous dynamic random access memory (DDR2 SDRAM) controller. IC 100 may further include bus circuitry 110 configured to provide compatibility with a variety of different bus architectures, including, but not limited to, Universal Serial Bus (USB), Serial Advanced Technology Attachment (SATA), Peripheral Component Interface (PCI), PCI-Express and System Management Bus (SMBus).

IC 100 may also include SerDes circuitry 112, which may include numerous components configured to perform link resets in a multi-link and lane SerDes system. Some particular examples of the structure and operations of SerDes circuitry 112 are discussed in further detail hereinbelow.

Figure 2:
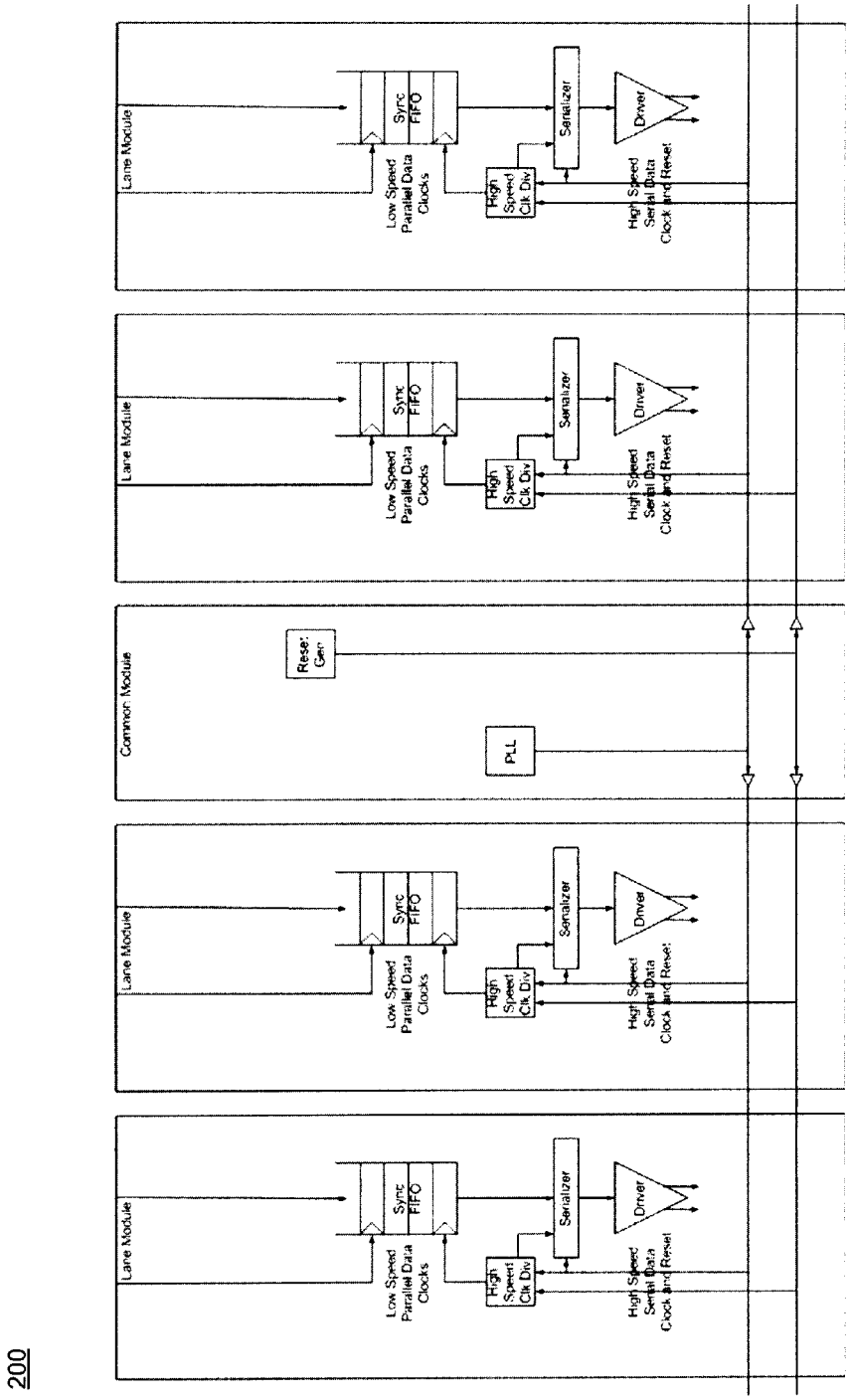
FIG. 2 is a diagram depicting an embodiment of a link reset process in accordance with the present disclosure.

Referring now to FIG. 2, a diagram depicting an example of SerDes circuitry 200 is provided. In this particular example, a single link/multi-lane configuration having one or more lanes operating as a single link and one standard/rate supported at a time is depicted. Accordingly, this example may be configured so that data transmitted from the serializer using the driver may be lined up with minimal specified skew across all lanes in a link. Parallel data entering all sync FIFOs arrives in phase across all lanes, and is timed to the FIFO input clock. This may require that the delta in write data versus read data of the FIFO be the same across all lanes. Any delta adds to the lane-to-lane skew. In some cases, small deltas may be acceptable while full word deltas are generally not acceptable. Write and read clocks for the sync FIFO may have the same frequency, but not necessarily the same phase. Reset of the FIFO and lane-to-lane skew may require FIFO read clocks to be in phase across all lanes.

As is shown in FIG. 2, in this particular example the reset of the link may be centrally located (e.g., initiated from the common module). The reset may be propagated from the common module to the lanes in the same way the high speed clocks are. The reset may be asynchronous to the high speed clock, which may result in the output low speed parallel data clock from the high speed clock divider being out of phase. This is acceptable margin for lane-to-lane skew, but does make meeting timing in the sync FIFO reset circuits more challenging.

Figure 3:
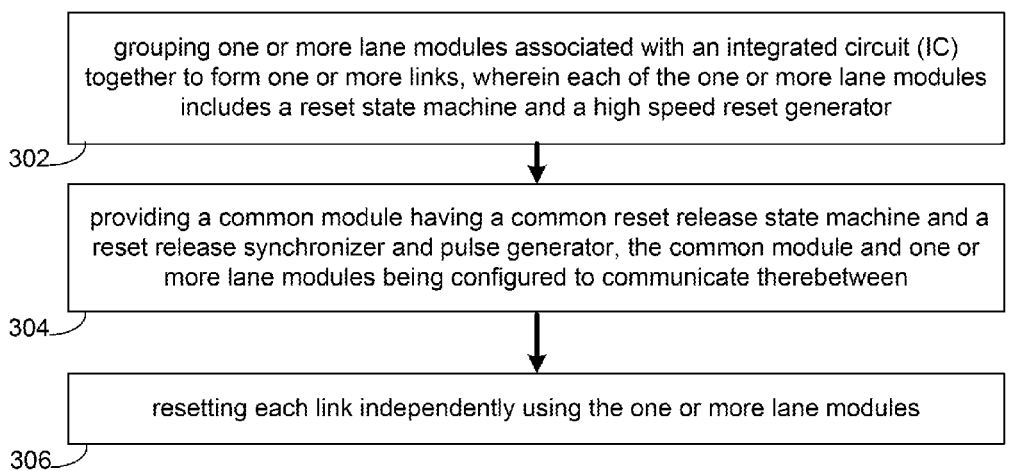
FIG. 3 is a flowchart depicting operations consistent with an embodiment of link reset process in accordance with the present disclosure.

Referring now to FIG. 3, a flowchart 300 depicting exemplary operations associated with the link reset process of the present disclosure is provided. The method may include grouping (302) one or more lane modules associated with an integrated circuit (IC) together to form a link, wherein each of the one or more lane modules includes a reset state machine and a high speed reset generator. The method may also include providing (304) a common module having a common reset release state machine and a reset release synchronizer and pulse generator, the common module and one or more lane modules being configured to communicate therebetween. The method may further include resetting (306) each link independently using the one or more lane modules. Each of these is discussed in further detail herein.

Figure 4:
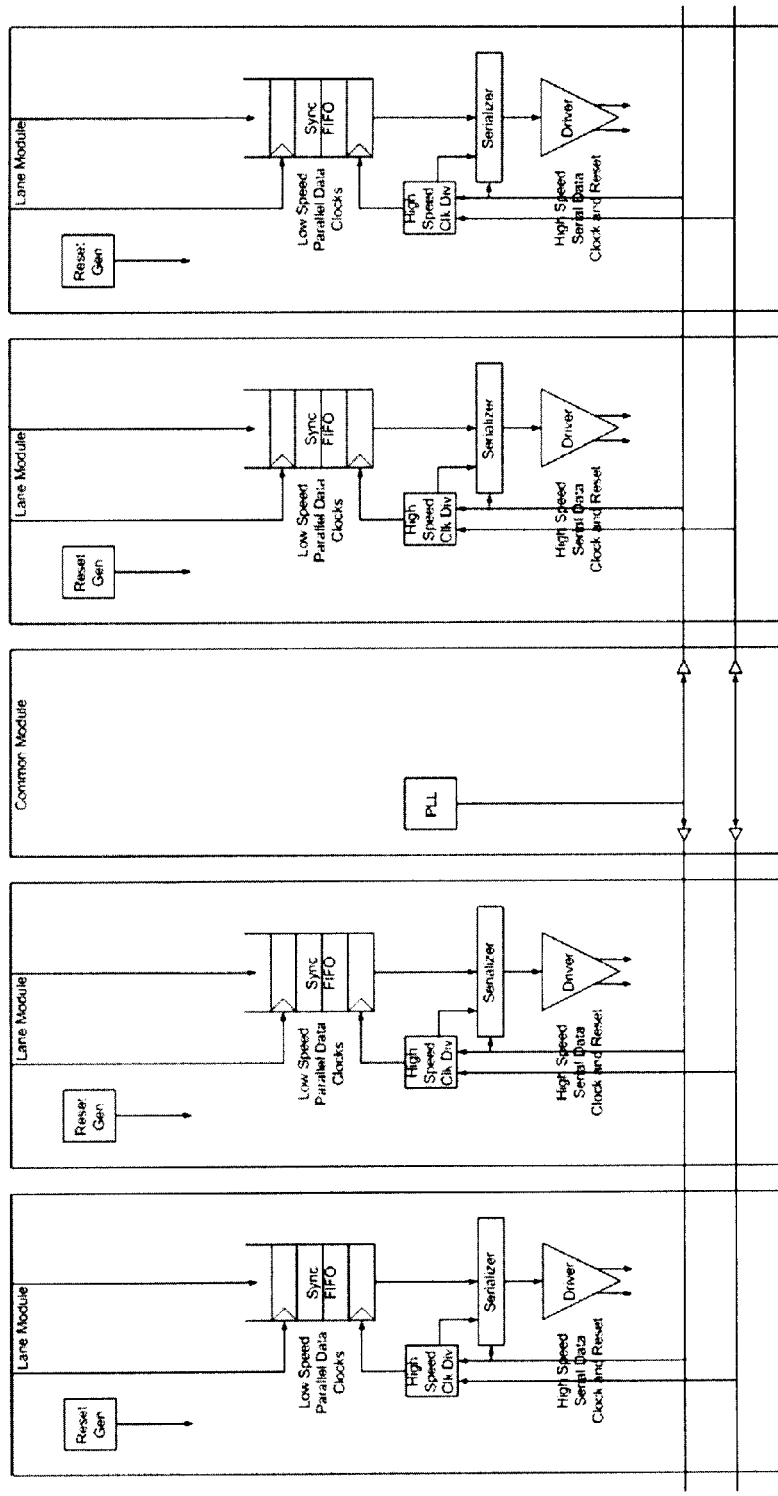
FIG. 4 is a diagram depicting an embodiment of a link reset process in accordance with the present disclosure.

Referring now to FIG. 4, a diagram depicting an example of SerDes circuitry 400 is provided. This particular example differs from that shown in FIG. 2 in that due to the multiple links being implemented, the reset generation is no longer centrally located. Here, each link must be able to be reset independently. Therefore, each lane must have a reset generation circuit. Furthermore, multiple lanes may be grouped together to form a link. Therefore, the reset generation circuit from one lane (e.g., master lane) may be required to reset other lanes (e.g., slave lanes) as well. One proposal would be to send each lane reset to the area of the high speed clock circuits, and propagate the reset to all the links. However, most of the time the high speed reset may be propagating the opposite direction relative to the high speed clocks. As a result, it may be more difficult to meet lane to lane skew requirements. Embodiments provided below provide a mechanism that allow for resets to be associated with a link and reset independently of other links and distinct from the common module.

Figure 5:
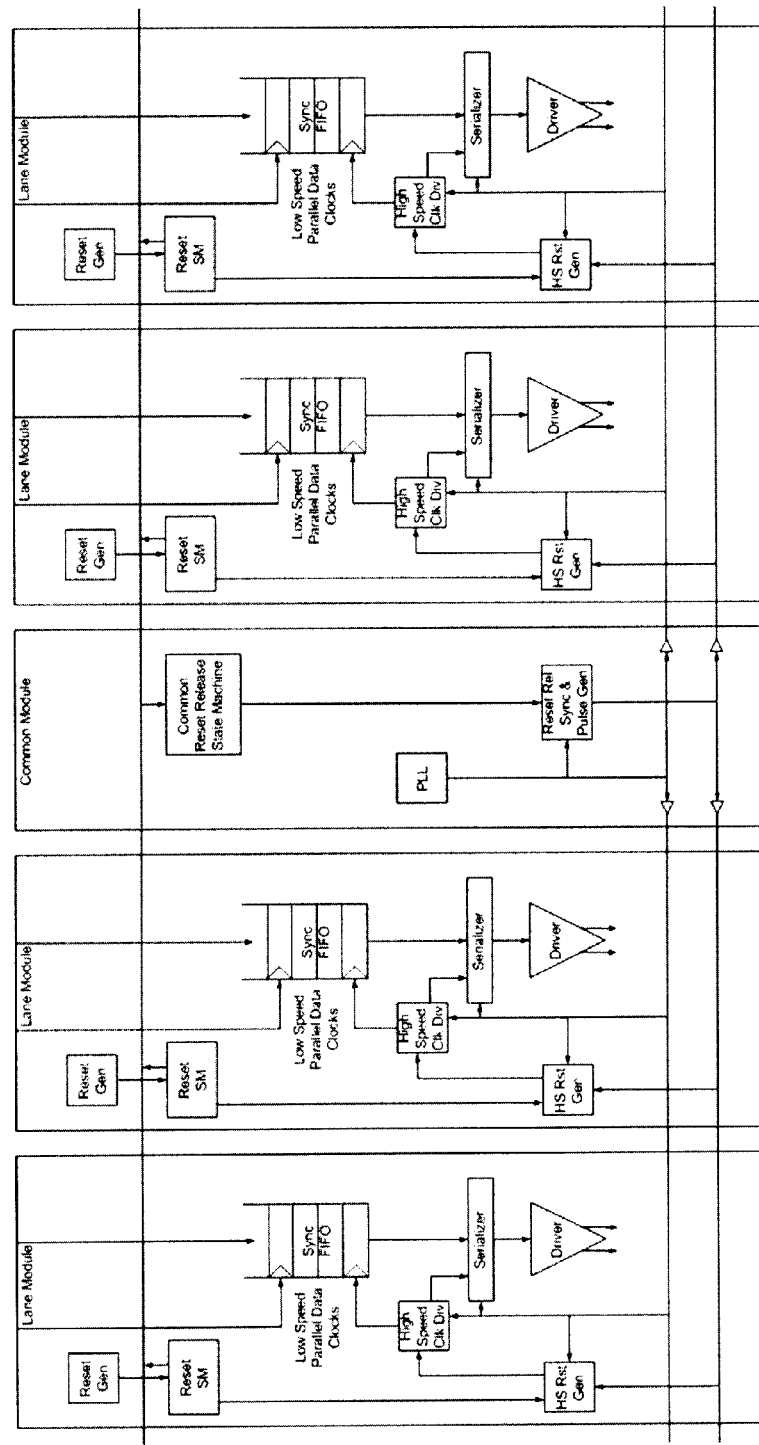
FIG. 5 is a diagram depicting an embodiment of a link reset process in accordance with the present disclosure.

Referring now to FIG. 5, a diagram depicting an example of SerDes circuitry 500 is provided. This particular example shows one possible general case solution illustrated for single data rate. In some embodiments, the high speed reset signal may be replaced by a high speed reset release pulse. SerDes circuitry 500 may further include a high speed reset generator configured to generate the actual reset signal for the clock divider. The reset state machine in the lane may be configured to hold the high speed reset generator in reset and control when it should look for a high speed reset pulse. The common reset release state machine may receive requests to generate a reset pulse from the lane reset state machines, arbitrate between requests, and generate a reset pulse request. The reset release synchronize and pulse generator may be configured to synchronize the request and generates a high speed reset release pulse to the lanes. In some embodiments, the high speed reset release pulse may be synchronously launched and captured.

Figure 6:
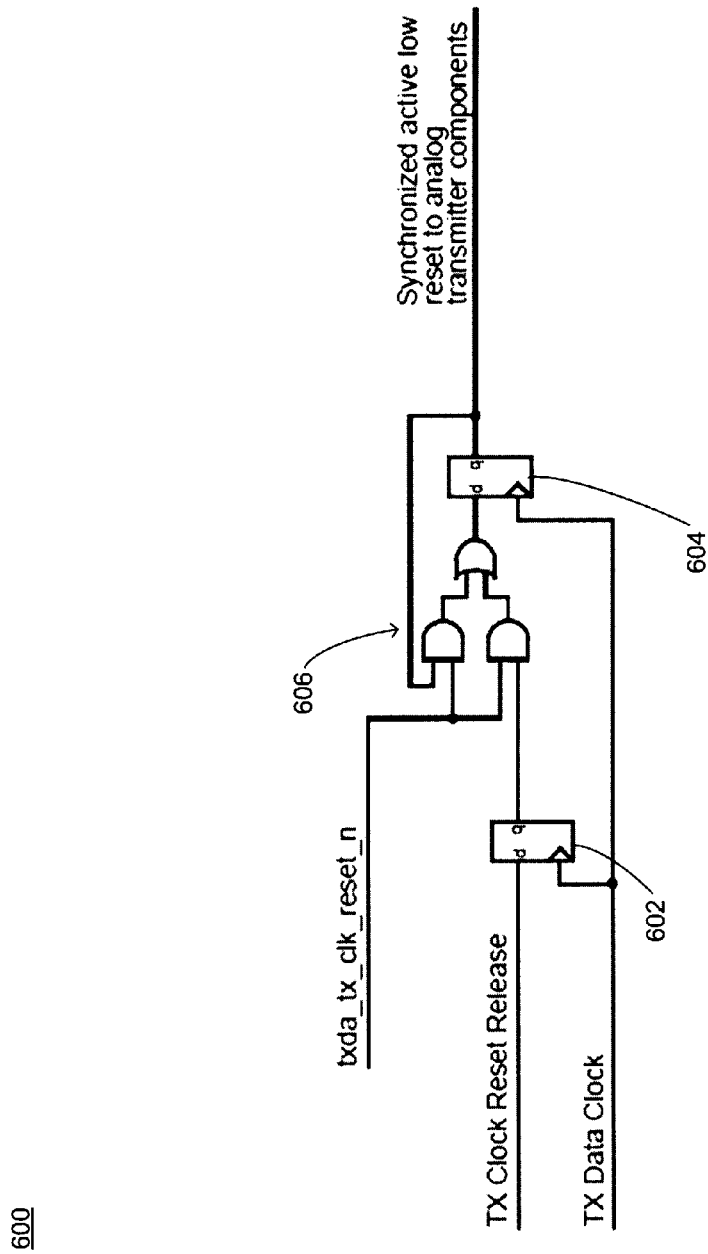
FIG. 6 is a diagram depicting an embodiment of a link reset process in accordance with the present disclosure.

Referring now to FIG. 6, an embodiment of a high speed reset generator 600 is depicted. High speed reset generator 600 may include flip-flops 602 and 604 as well as combinational logic 606. In some embodiments, flip-flop 604 may be configured to generate a synchronous reset to the high speed clock divider. Flip-flop 602 may be configured to capture the reset release pulse from the common module synchronously. Combinational logic 606 may be configured to hold the reset active when txda_tx_clk_reset_n is active, and synchronously release the reset when the TX clock reset release pulse is received. It should be noted that the timing of the reset release pulse may be configured such that it arrives long enough after txda_tx_clk_reset_n changes to 1'b1, that there are no metastability issues.

Referring again to FIG. 5, reset release synchronizer and pulse generator may be configured to receive as an input a low speed pulse from the common reset release state machine, and synchronize it to the high speed data clock. Reset release synchronizer and pulse generator may utilize the synchronized pulse to detect the rising edge, and generate a pulse on the high speed clock domain. The pulse on the high speed clock domain is what is captured by the high speed reset generator to release the reset in the lane. The pulse on the high speed clock domain may be designed to be captured synchronously across all the lanes.

In some embodiments, common reset release state machine may be configured to generate a low speed reset release pulse to the reset release synchronizer and pulse generator at the request of the reset generator in the master lanes. All reset state machines in the master lanes may generate requests for a reset release pulse when their respective link needs to be released from reset. Prior to generating the low speed reset release pulse, the state machine may inform the reset state machines in the lanes that a reset release pulse will be generated. A timing arbitration mechanism may be defined between the lane reset state machines and the common reset release state machine, such that the lanes know when a reset release pulse is applicable for a given link. This may be implemented using any suitable approach.

In some embodiments, lane reset state machine may be configured to control the reset process for a given link at the request of the master link's reset generator. When a link is in reset, the reset signal going to the high speed reset generator is held active, such that all link clock dividers are in the reset state. When a link is to be released from reset, this state machine may be configured to send a reset release request to the common reset release state machine, and wait for a response indicating that a reset release pulse will be generated. After receiving the response, this state machine may release the reset signal going to the high speed reset generator, so the high speed circuits are released from reset when the high speed reset release pulse is captured.

Figure 7:
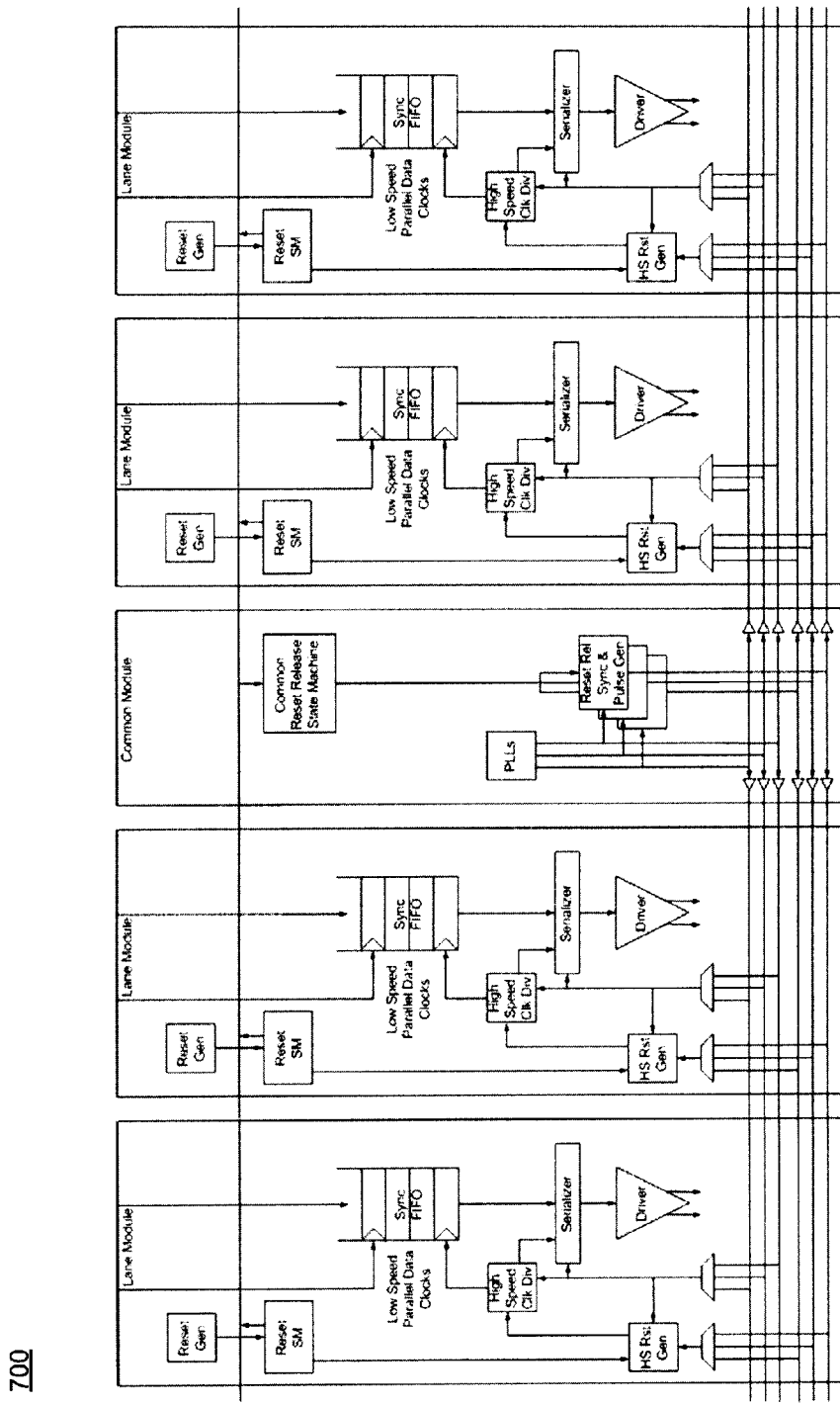
FIG. 7 is a diagram depicting an embodiment of a link reset process in accordance with the present disclosure.

Referring now to FIG. 7, an embodiment depicting an example of a multiple data rate solution is provided. In some embodiments, the multi link/multi lane approach may address the problem of releasing multiple links with multiple lanes from reset in an optimal way that maintains lane to lane skew requirements. There is no logical limit to the number of links that can be supported. In some embodiments, this example may have a better low speed clock skew results across lanes than previous attempts. Because the reset release pulse may be synchronized, the release of the clock divider from reset may be synchronous. Accordingly, low speed clocks for lanes in a given link may have a tighter phase relationship, making meeting timing easier across lanes. Corresponding lane-to-lane skew results have been found to be extremely small.

In some embodiments, the present disclosure may provide parallel support of multiple protocols and data rates and may be expandable to support multiple protocols and data rates simultaneously on different links. For example, some of these may include, but are not limited to, different Peripheral Component Interconnect Express ("PCIe") Generation rates on different links, PCIe Generation rates on some links, and USB 3.0 rates on other links, etc. When multiple link data rates are required, multiple high speed clock signals going to the lanes may be required. For example, for PCIe, three different high speed clock signals may be generated from common, for each of the data rates. In order to support multiple data rates, the reset release synchronizer and pulse generator may be replicated for each high speed clock, resulting in one high speed reset release pulse signal going to the lanes for each high speed clock signal. Additionally and/or alternatively, multiplexers ("MUXes") may be added to the lanes to select the required clock and reset signal for a given data rate. FIG. 7 depicts such a configuration.

In some embodiments, multiple clocks may be utilized and configured to implement a unique reset release synchronizer and pulse generator in common that may be configured to select a clock to generate the reset pulse off of, rather than replicating the generator multiple times for a number of different clock domains. This type of configuration may provide a number of advantages, for example, it may require a fewer number of high speed reset lines.

In some embodiments, if lane-to-lane skew requirements are not as rigid, the common reset release synchronizer and pulse generator may be left out, and the reset release pulse passed asynchronously to the lanes. If there are no lane-to-lane skew requirements, the common components may be left out completely.

In some embodiments, the SerDes circuitry described herein may include one or more variations, some of which may include, but are not limited to, running the reset from the master lane to all other lanes, running individual high speed resets per lane from common to the lanes, running individual high speed resets per link from common to the lanes, running a single reset release pulse to all the lanes, etc.

Embodiments of the present disclosure may provide an efficient design having a small number of relatively simple components. Embodiments may be flexible and scalable and may be used for many lane and link configurations, as well as many data rates for a give implementation.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for use with a serializer/deserializer comprising:
    grouping one or more lane modules associated with an integrated circuit (IC) together to form one or more links, wherein each of the one or more lane modules includes a reset state machine and a high speed reset generator;
    providing a common module having a common reset release state machine and a reset release synchronizer and pulse generator, the common module and one or more lane modules being configured to communicate therebetween; and
    resetting each link independently using the one or more lane modules.

2. The method of claim 1, wherein the one or more lane modules includes a master lane configured to reset a slave lane.

3. The method of claim 1, wherein the high speed reset generator is configured to generate a reset signal.

4. The method of claim 1, wherein the reset state machine is configured to hold the high speed reset generator and determine when to search for a high speed reset pulse.

5. The method of claim 1, wherein the common reset release state machine is configured to receive a request to generate a reset pulse from at least one lane reset state machine.

6. The method of claim 1, wherein the common reset release state machine is configured to arbitrate between one or more requests and generate a reset pulse request.

7. The method of claim 6, wherein the reset release synchronizer and pulse generator is configured to synchronize the reset pulse request and generate a high speed reset release pulse to each of the one or more lane modules.

8. The method of claim 7, wherein the high speed reset release pulse is synchronously launched and captured.

9. An apparatus, comprising:
    an integrated circuit (IC) including one or more lane modules grouped together to form one or more links and a common module having a common reset release state machine and a reset release synchronizer and pulse generator, wherein each of the one or more lane modules includes a reset state machine and a high speed reset generator, and wherein each link is capable of being reset independently of another link.

10. The apparatus of claim 9, wherein the one or more lane modules includes a master lane configured to reset a slave lane.

11. The apparatus of claim 9, wherein the high speed reset generator is configured to generate a reset signal.

12. The apparatus of claim 9, wherein the reset state machine is configured to hold the high speed reset generator and determine when to search for a high speed reset pulse.

13. The apparatus of claim 9, wherein the common reset release state machine is configured to receive a request to generate a reset pulse from at least one lane reset state machine.

14. The apparatus of claim 13, wherein the common reset release state machine is configured to arbitrate between one or more requests and generate a reset pulse request.

15. The apparatus of claim 14, wherein the reset release synchronizer and pulse generator is configured to synchronize the reset pulse request and generate a high speed reset release pulse to each of the one or more lane modules.

16. The apparatus of claim 15, wherein the high speed reset release pulse is synchronously launched and captured.

17. A method for use with a serializer/deserializer comprising:
    grouping one or more lane modules associated with an integrated circuit (IC) together to form one or more links, wherein each of the one or more lane modules includes a reset state machine and a high speed reset generator;
    providing a common module having a common reset release state machine, the common module and one or more lane modules being configured to communicate therebetween; and
    resetting each link independently using the one or more lane modules.

18. The method of claim 17, further comprising:
    asynchronously passing a reset release pulse to the one or more lanes.

19. The method of claim 17, wherein the at least one link includes a plurality of links each complying with a different transmission protocol.

20. The method of claim 19, wherein at least one of the transmission protocols includes Peripheral Component Interconnect Express.

* * * * *